United States Patent [19]

Gyorgy et al.

[11] 4,198,689

[45] Apr. 15, 1980

[54] GARNET MAGNETORESISTIVE SENSOR FOR MAGNETIC FIELDS

[75] Inventors: Ernst M. Gyorgy, Madison; Roy C. Le Craw, Summit; Raymond Wolfe, New Providence, all of N.J.

[73] Assignee: Bell Telephone Laboratories, Incorporated, Murray Hill, N.J.

[21] Appl. No.: 937,958

[22] Filed: Aug. 30, 1978

[51] Int. Cl.$^2$ .............................................. G11C 19/08
[52] U.S. Cl. ........................................ 365/8; 365/33; 365/36
[58] Field of Search ...................... 365/7, 8, 30, 32, 33

[56] References Cited

U.S. PATENT DOCUMENTS 3,973,183  8/1976  Kataoka .................................... 365/8

OTHER PUBLICATIONS

Physics Review B-vol. 14, no. 6; Sep. 15, 1976 pp. 2520-2527.
Material Research Bulletin-vol. 12, 1977; pp. 289-298.

*Primary Examiner*—James W. Moffitt
*Attorney, Agent, or Firm*—Peter V. D. Wilde

[57] ABSTRACT

The discovery of a magnetoresistive effect in oriented, crystalline, semiconducting iron garnet materials is used to design devices which detect the presence or orientation of magnetic fields. The principal measure of this effect is that the resistance between two electrodes (12) on the garnet body (11) varies as an imposed magnetic field (14, 15) produces a change in the direction of the magnetization of the body (11). This effect is useful when the garnet is so constituted as to possess a resistivity from $10^3$ to $10^7$ ohm-centimeters. Also, the anisotropy field of the garnet body must be comparable to less than the magnitude of the magnetic field to be detected. One aspect of particular utility for magnetic "bubble" detectors (in magnetic bubble memories) is the isotropic character of the resistance when the magnetization is varied in the (111) plane but the significant change of resistance when the magnetization is moved to the [111] direction.

13 Claims, 2 Drawing Figures

GARNET MAGNETORESISTIVE SENSOR FOR MAGNETIC FIELDS

TECHNICAL FIELD

The invention is in the field of magnetic measurement. More particularly, use is contemplated, for example, in the field of the detection of information stored as magnetic domains.

BACKGROUND OF THE INVENTION

Prior art detectors of changes in the magnitude or orientation of magnetic fields include inductive pickups and magnetoresistance effects in metals. Inductive pickup devices include the pickup heads commonly employed for the reading of magnetic tapes. Many magnetic bubble memories in current manufacture employ thin film permalloy elements as magnetoresistive detectors of magnetic bubble information (U.S. Pat. No. 3,702,995, issued Nov. 14, 1972 to A. H. Bobeck). Although these and other magnetic field detectors exist, magnetic information storage is an expanding field. Thus, different types of detectors which can be adapted to meet various device requirements are eagerly sought.

SUMMARY OF THE INVENTION

A novel device and method for the detection of changes in magnetic fields is based on the discovery of a magnetoresistive effect in oriented iron garnet bodies, which are so constituted as to possess significant electrical conductivity. By "changes in magnetic fields" we mean both change in direction of the field or change in strength of the field, provided in the former case the field strength is at least comparable to the anisotropy field $H_k$, and in the latter case the change is between values substantially lower than $H_k$, or between such a value and a value at least comparable to $H_k$, provided the external field that changes in strength is not parallel to the anisotropy field $H_k$. By "anisotropy field" we mean herein the effective field that aligns the magnetization of the iron garnet body along an easy direction, where by "easy direction" we mean a direction in the body in which the magnetization tends to lie in the absence of an external magnetic field $H_E$. The resistivity range of most significant device interest is from $10^3$ to $10^7$ ohmcentimeters. It has been found that for such bodies the electrical resistance between two electrodes varies with changes in the orientation of the magnetization of the body. If the magnetic field to be detected is comparable to or larger than the anisotropy field $H_K$ of the body and in a different direction than $H_k$, the magnetic field will reorient the magnetization. The change in the direction of magnetization then produces a resistance change which can for instance be detected by a resistance measuring device.

The possible uses of such magnetic field sensing devices are as varied as the synchronization of an electrical network to the rotation of an electric motor and the reading of information stored as magnetic domains on tapes, discs, drums and in magnetic bubble memories. For use in magnetic bubble memories, one particularly advantageous feature of the discovered magnetoresistance effect is the discovery that the resistance of exemplary materials, in the form of thin films with [111]normal, did not change significantly as the magnetization changed direction in the (111) plane (i.e., the magnetoresistance of such films is isotropic for a magnetic field in (111). Thus, the bubble drive field in bubble memories, which usually rotates in the (111) plane, produces no resistance change. However, the presence of a magnetic bubble produces reorientation perpendicular to the plane and a detectable resistance change.

DETAILED DESCRIPTION

Figure 1:
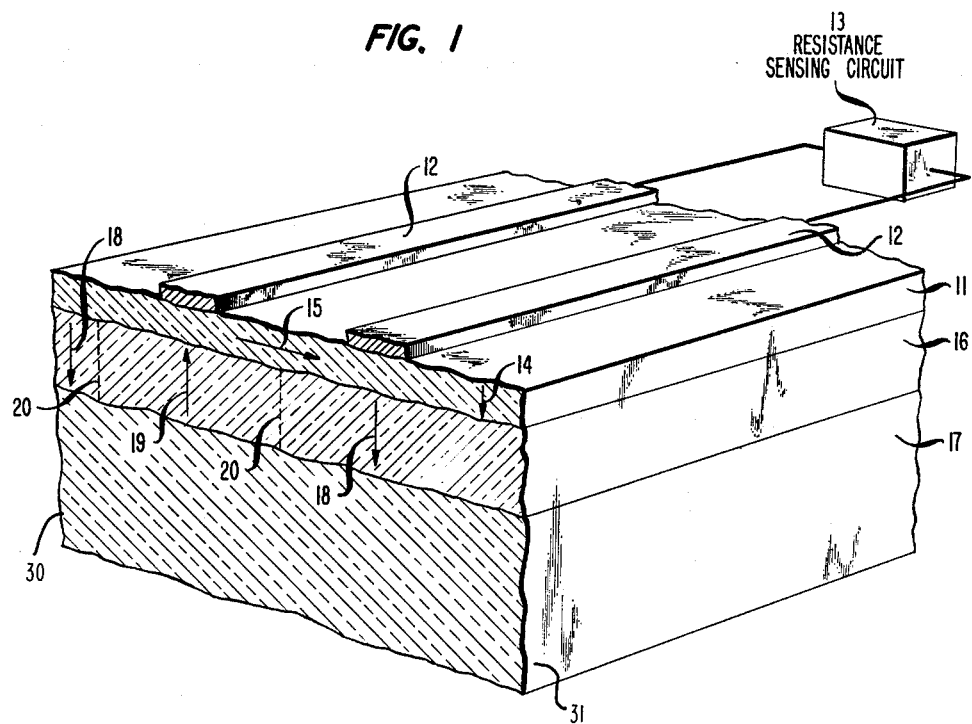
FIG. 1 is a perspective view in section of an examplary device of the invention incorporated in a magnetic bubble memory.

The inventive device and method for the detection of changes in magnetic fields is based on the discovery of a magnetoresistive effect in oriented bodies of semiconducting iron garnets. The effect can be used to detect changes in direction of a magnetic field or the presence or absence of a magnetic field of a given direction. While the electrical conductivity mechanism in these materials is not entirely understood, they can be termed semiconducting since they possess several of the aspects of the more usual semiconducting materials. They are poorly conducting; they can exhibit both p-type and n-type conductivity; and they become more conductive at higher temperature. This type of electrical conductivity in garnets is well known and many aspects have been investigated (see, for example, *Physical Review B*, 14 [Sept. 15, 1976] pages 2520–2527).

The magnetoresistive effect disclosed here has been discovered in both p-type and n-type iron garnets grown by partial substitution of iron by Group 2 or Group 4 constituents and in n-type iron garnets grown from a lithium rare earth molybdate flux. It has been observed in both bulk crystals and epitaxial crystal films and has been observed for yttrium iron garnet, europium iron garnet and europium lutetium iron garnet. For example, epitaxial layers of yttrium iron garnet grown on a (111) gadolinium gallium garnet substrate from a lithium rare earth molybdate flux (*Materials Research Bulletin*, 12 [1977] pages 289 through 298) possessed a resistivity of approximately $10^5$ ohm centimeters and were shown to be n-type by Seebeck effect measurements. For these materials the resistance between two electrodes placed on the surface showed no observable change when the magnetization was rotated in the (111) plane but changed by approximately 0.5 percent when the magnetization was moved from the (111) plane to the [111] direction. During these measurements the magnetization was caused to change by imposing an external magnetic field comparable to or larger than the anisotropy field $H_k$ of the garnet body. Similar effects were observed in silicon doped yttrium iron garent bulk crystals and thin films grown from a lead oxide boron oxide flux. These materials were n-type semi-conductors. The effect was also observed in p-type calcium doped yttrium iron garnet.

As far as can be determined the magnetroresistive effect is characteristic of the iron lattice in the garnet. It is considered that the magnetoresistive effect is characteristic of semiconducting iron garnets in which iron constitutes at least 70% of the tetrahedral and octahedral occupants. While the experimental observation has been made on bulk single crystals or single crystal epitaxial layers the effect is not limited to single crystals but should be observed on oriented polycrystalline bodies possessing an average preferential orientation appropriate to observation of the magnetoresistive effect. The preferred resistivity range is from $10^3$ to $10^7$ ohm-centimeters. Above this resistivity range the measurement impedance usually becomes too high. Below this resistivity range the high doping levels needed may produce crystal growth difficulties.

It is common in the garnet crystal growth area, for example, in the growth of magnetic bubble garnet elements, to employ partial substitution of nonmagnetic constituents on iron sites. This is done for the purpose of reducing the average magnetic moment of the material in order to achieve the desired bubble size. However, in this context care is taken to preserve the electrical neutrality of the lattice, thus, the insulating nature of the garnet material. For example, if silicon or germanium (quadruvalent constituents) are employed, care is taken to incorporate an equal amount of calcium or strontium (divalent constituents) in substitution for the trivalent iron. This is in contrast to the practice described above in which an electrical unbalance is desired to produce significant electrical conductivity. The thickness of the semiconducting garnet body is preferably at least 0.1 micrometers to maintain reasonably low measurement impedance. It is also possible to introduce conductivity producing species into the surface of an insulating garnet by such techniques as ion implantation.

A particularly unexpected and important discovery, made while investigating single crystal garnets, is the fact that no resistance change was observed as the orientation of the magnetization was varied in the (111) plane, with current flowing in that plane. That is to say, the magnetoresistance was observed to be isotropic for all current directions in (111), for magnetic fields also in (111). This was verified for several directions of current flow in the molybdate-grown layers and for bulk crystals and epitaxial layers of yttrium iron garnet doped with silicon or germanium. This result is surprising since it implies a highly specific and unusual relationship between several of the magnetic coefficients of the crystalline material. The importance of this result for magnetic bubble detectors will be explained below.

In order to employ this magnetoresistive effect for the detection of magnetic field, the magnetization of the garnet body must substantially follow the magnetic field to be detected. In order for the magnetization to follow the magnetic field $H_k$ the anisotropy field of the semiconducting iron garnet body must be less than or comparable to the magnitude of the field to be detected. In this situation "comparable to" is intended to mean within approximately a factor of two. When the imposed magnetic field to be sensed is approximately one tenth of the anisotropy field of the semiconducting garnet body, the magnetic field starts to influence the orientation of the magnetization of the body. By the time the magnetic field is approximately half of the anisotropy field, the magnetoresistive effect is becoming appreciable and significant. The largest effects occur at magnetic fields greater than the anisotropy field. For most situations no further improvement occurs when the magnetic field is more than twice the anisotropy field.

Several methods are known to adjust the anisotropy field of a garnet material. For example the body can be placed in tensile or compressive stress. An appropriately selected stress will interact with the magnetostriction of the garnet material, producing the desired adjustment of anisotropy. Appropriate selection of the garnet constituents can produce a growth induced anisotropy which has been extensively employed in magnetic bubble technology. The anisotropy field can also be varied by ion implantation. All of these effects must be considered as added to the shape anisotropy of the magnetic body. Several of these anisotropy influencing mechanisms are discussed and further references given in an article in *Applied Physics Letters*, Vol. 19, [1971] pages 298 through 300.

Figure 2:
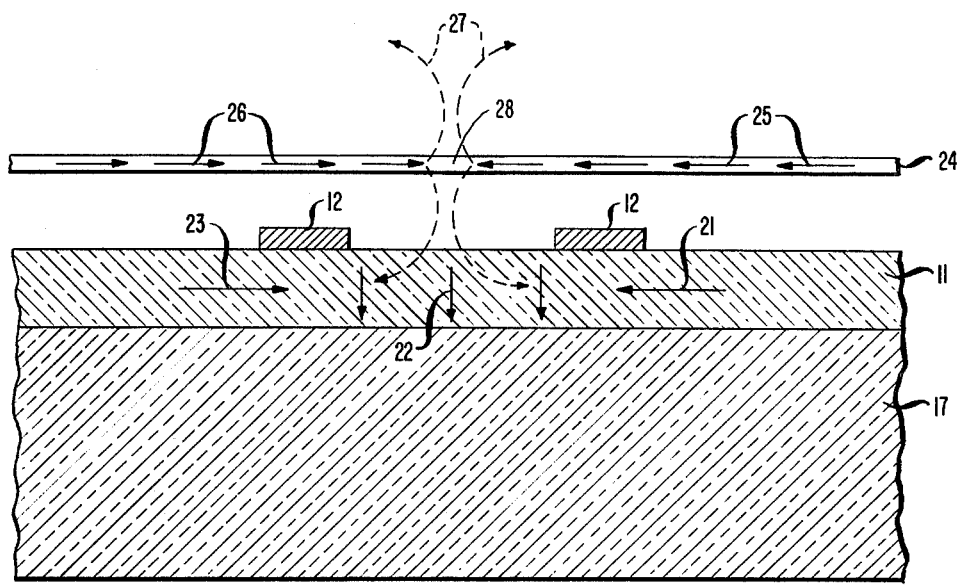
FIG. 2 is an elevational view in section of an exemplary device of the invention used as a magnetic recording tape reader.

Two examples of devices employing the above described magnetoreisistive effect are illustrated in FIGS. 1 and 2. The basic elements of the device are an oriented semiconducting iron garnet body 11 to which two electrodes 12 are electrically connected. The resistance of the electrical path between the electrodes 12 is measured by resistance sensing circuit 13, which is shown schematically as being connected to the electrodes 12. In the illustrative device of FIG. 1, the semiconducting garnet layer 11 is epitaxially grown on a crystalline layer 16 which supports localized magnetic domains known in the art as "bubbles". This bubble-supporting layer 16 is typically epitaxially grown on a nonmagnetic crystalline layer 17 (often gadolinium gallium garnet). Such devices are used as memories for information processing systems. In such a memory a bit of information is stored as a localized region in which the magnetization is in a direction opposite the magnetization of the surrounding material. In FIG. 1 this is indicated by the fact that the arrow 19, symbolizing the direction of magnetization of the region between the dashed lines 20, is opposite in direction to the arrows 18 which symbolize the direction of magnetization of the surrounding material. The arrow 14 indicates the direction of magnetization of the semiconducting garnet layer 11 in the region removed from the magnetic bubble 19. In the region of the semiconductive garnet layer 11 above the boundary 20 between the bubble and the surrounding region a horizontal magnetic field is produced by the magnetization of the bubble supporting layer 16 which reorients the magnetization of the semiconductive layer as indicated by the arrow 15. In the operation of the bubble memory the magnetic bubble is transported laterally (e.g. to the right of FIG. 1, i.e., in the direction from edge 30 to edge 31, substantially in a direction perpendicular to the long dimension of electrodes 12) through the bubble supporting layer 16, producing a reorientation of the magnetization of the semiconductive layer 11 from the direction indicated by the arrow 14 to the direction indicated by the arrow 15 in the space between the electrodes 12. This reorientation of magnetization produces a change of resistance due to the magnetoresistive effect disclosed above. This change of resistance is sensed by the resistance sensing circuit 13. In order to increase the resistance change, the normally round bubbles can be stretched to more nearly fill the space between the electrodes 12. This can be done, for example, by passing a current pulse along one of the electrodes 12.

In many magnetic bubble memories, the bubble supporting layer 16 is parallel to a (111) crystal plane. Thus an epitaxially deposited magnetoresistive layer 11 would be grown with the same orientation. It is common in bubble memories to produce a lateral translation of magnetic bubbles by applying an external magnetic field rotating in the plane of the bubble supporting layer 16. For such memories, the discovery that the magnetoresistive effect found in semiconducting iron garnets is isotropic for applied magnetic fields in (111), for all directions of current in (111), is of particular importance since, because of the this isotropy, the rotating drive field produces no output signal. Such an output signal, unconnected with information storage, is produced by commonly used permalloy magnetoresistive bubble detection devices. The use of these permalloy devices requires additional circuity to extract the memory information from the large signal produced by the rotating field.

FIG. 2 illustrates the use of the disclosed magnetoresistive effect to sense information stored as magnetic domains on a tape, disk or drum. The information is stored in the storage medium 24 (e.g., a magnetic recording tape) by magnetization reversals located along the storage medium. One such bit of information is illustrated by the fact that the arrows 25 symbolizing magnetization of the material in the right portion of storage medium 24 are oriented in the opposite direction to the arrows 26, symbolizing the direction of magnetization of the material at the left. The two electrodes 12 affixed to a layer 11 of semiconductive iron garnet material form the reading "head" which senses the magnetization reversal by sensing the change in the direction of the magnetic field 27 produced by the magnetization of the information storage material 24. The magnetic field 27 produced by the magnetization of the medium 24 away from the position of magnetization reversal, is generally parallel to the plane of the semiconductive garnet material 11 and the magnetization of that material is, correspondingly, parallel to the plane, as indicated by arrows 21 and 23. In the region of reversal 28 the magnetic field 27 has a strong vertical component which produces a vertical reorientation of the magnetization of the semiconductive garnet material 11 indicated by the arrow 22. As the storage medium 24 is propagated (e.g. to the right) past the electrodes 12, the magnetization of the semiconductive garnet between the electrodes 12 is reoriented. This reorientation produces a change in the resistance between the electrodes 12 which can be sensed by a resistance sensing circuit.

As explained above the design of such a reading head involves the selection of the anisotropy field of the garnet body 11 to be less than or comparable to the magnitude of the magnetic field to be sensed. There are two basic modes of operation in this context. The anisotropy field of the garnet body 11 can be such as to maintain the magnetization of the body in a direction parallel to the plane. In the absence of any other significant external magnetic field in this mode of operation the magnetization is pulled towards the direction perpendicular to the plane by the vertical component of the imposed magnetic field 27. In the other mode of operation the anisotropy field is selected so as to maintain the magnetization of the garnet body 11 in a direction perpendicular to the plane in the absence of a significant external magnetic field. In this case it is the component of the magnetic field 27 that is parallel to the plane of the body 11 which pulls the magnetization of the garnet body 11 substantially parallel to the plane. In one experimental device of the latter sort a layer of semiconductive yttrium iron garnet was deposited on a gadolinium gallium garnet substrate under such conditions as to maintain the deposited layer under tension. This resulted in a strain induced anisotropy sufficient to overcome the shape anisotropy of the layer and cause the magnetization to lie appreciably out of the plane of the layer. An applied in-plane field of 150 oersted was sufficient to reorient the magnetization to lie substantially in the plane, resulted in a resistance change of 0.35%.

While the described exemplary devices employed epitaxially grown, i.e., single crystal, semiconducting garnet layers, oriented polycrystalline layers could also be used. By "oriented" we typically mean here a polycrystalline layer in which the crystallites have an easy direction substantially in common, as can be the case, for instance, if anisotropy is induced by a suitably chosen stress. But we do not intend to restrict the meaning of the term to layers so produced since other ways of producing "oriented" polycrystalline layers are known to those skilled in the art.

Although the discussion was primarily in terms of the detection of magnetization reversal, it will be clear to a person skilled in the art that the inventive concept can equally well be applied to detecting the presence or absence of a magnetic field in a certain direction, as well as to detecting appropriate changes in the strength of a magnetic field. Also, many different electrode arrangements are possible, thus the simple 2-electrode pattern described herein is merely illustrative.

What is claimed is:

1. Apparatus for sensing a change in a magnetic field $H_E$, comprising a semiconducting body, and at least two electrodes, spaced apart from one another and attached electrically conducting to the semiconducting body, CHARACTERIZED IN THAT the semiconducting body consists essentially of single crystal or oriented polycrystalline iron garnet in which iron atoms occupy at least 70% of the tetrahedral and octahedral lattice sites, constituted to have electrical resistivity from $10^3$ ohm-cm to $10^7$ ohm-cm, whereby a change of $H_E$ produces a change in the electrical resistance between the at least two electrodes.

2. A device of claim 1 in which the semiconducting body consists essentially of a layer, at least 0.1 micrometers thick, located on a substrate.

3. A device of claim 2 in which the semiconducting body is essentially oriented to have a [111]crystallographic direction approximately parallel to the direction normal to the body.

4. A device of claim 2 in which the semiconducting body has an induced easy direction.

5. A device of claims 3 or 4 in which the substrate consists essentially of a garnet material in which stable magnetic bubble domains can be propagated.

6. A device of claim 5 in which the semiconducting body is epitaxially grown on the substrate.

7. A device of claim 5 in which the semiconducting body is produced by ion implantation of the substrate.

8. A device of claim 5 in which the resistivity is approximately $10^5$ ohm-centimeters.

9. A device of claim 5 in which atoms of at least one member of the group consisting of Ca and Sr are incorporated into the iron garnet semiconducting body.

10. A device of claim 5 in which atoms of at least one member of the group consisting of Si and Ge are incorporated into the iron garnet semiconducting body.

11. A device of claim 10 in which the iron garnet is yttrium iron garnet.

12. A method for sensing a change in a magnetic field $H_E$, comprising
   (a) imposing $H_E$ on a semiconducting layer consisting essentially of a single crystal or oriented polycrystalline iron garnet material in which iron atoms occupy at least 70% of the tetrahedral and octahedral lattice sites, consistuted to have electrical resistivity from $10^3$ ohm-centimeters to $10^7$ ohm-centimeters, and
(b) detecting a change in resistivity of the semiconducting layer.

13. The method of claim 12 in which the semiconducting layer is so oriented with respect to $H_E$ that a change in $H_E$ produces a reorientation of the magnetization of at least part of the semiconducting layer between a direction substantially parallel to the direction normal to the layer and a direction substantially in the plane of the layer.

* * * * *